United States Patent
Zhang et al.

(10) Patent No.: US 11,404,954 B2
(45) Date of Patent: Aug. 2, 2022

(54) PULSE WIDTH MODULATION INTERLEAVING

(71) Applicant: Carrier Corporation, Palm Beach Gardens, FL (US)

(72) Inventors: Da Zhang, Middlebury, CT (US); Thomas Bekasi, Meriden, CT (US); Ismail Agirman, Southington, CT (US); Bassel Al-Annouf, Farmington, CT (US); Christopher S. Czerwinski, Farmington, CT (US); Jeffrey M. Izard, Bolton, CT (US)

(73) Assignee: CARRIER CORPORATION, Palm Beach Gardens, FL (US)

( * ) Notice: Subject to any disclaimer, the term of this patent is extended or adjusted under 35 U.S.C. 154(b) by 199 days.

(21) Appl. No.: 16/651,823

(22) PCT Filed: Sep. 26, 2018

(86) PCT No.: PCT/US2018/052950
§ 371 (c)(1),
(2) Date: Mar. 27, 2020

(87) PCT Pub. No.: WO2019/067611
PCT Pub. Date: Apr. 4, 2019

(65) Prior Publication Data
US 2020/0251980 A1 Aug. 6, 2020

Related U.S. Application Data

(60) Provisional application No. 62/564,880, filed on Sep. 28, 2017.

(51) Int. Cl.
*H02M 1/12* (2006.01)
*H02M 1/14* (2006.01)
(Continued)

(52) U.S. Cl.
CPC ........... *H02M 1/12* (2013.01); *H02M 1/0043* (2021.05); *H02M 1/143* (2013.01); *H03M 3/372* (2013.01); *H02M 1/123* (2021.05)

(58) Field of Classification Search
CPC ...... H02M 1/12; H02M 1/0043; H02M 1/143; H02M 1/123; H03M 3/372
See application file for complete search history.

(56) References Cited

U.S. PATENT DOCUMENTS

| | | | |
|---|---|---|---|
| 5,751,138 A | * | 5/1998 | Venkata .............. H02M 5/4585 323/207 |
| 5,793,623 A | | 8/1998 | Kawashima et al. |

(Continued)

OTHER PUBLICATIONS

Gardner et al., "VFDs and Harmonics in HVAC application", URL:<http://c.ymcdn.com/sites/www.nasfa.net/resource/resmgr/learning_series/VFDs_and_Harmonics_in_HVAC_A.pdf>, 28 pages.

(Continued)

*Primary Examiner* — Yusef A Ahmed
(74) *Attorney, Agent, or Firm* — Cantor Colburn LLP (57) ABSTRACT

A pulse width modulation (PWM) interleaving system is provided. The PWM interleaving system includes active harmonic filters (AHFs). The AHFs are disposed in parallel with each other and with a load. The AHFs are electrically coupled to a common coupling point that is electrically interposed between a grid and the load. The AHFs are configured to affect, by PWM, a characteristic of current flowing between the grid and the load. The PWM interleaving system further includes a controller operably coupled to the AHFs and configured to synchronize the PWMs of the AHFs to thereby cancel ripple currents propagating towards the grid.

3 Claims, 6 Drawing Sheets

(51) Int. Cl.
  *H03M 3/00* (2006.01)
  *H02M 1/00* (2006.01)

(56) References Cited

U.S. PATENT DOCUMENTS

| | | | |
|---|---|---|---|
| 5,923,550 | A | 7/1999 | Kumar |
| 6,154,090 | A | 11/2000 | Wissmach et al. |
| 6,208,537 | B1* | 3/2001 | Skibinski ............... H02M 1/12 363/40 |
| 6,411,530 | B2 | 6/2002 | Hammond et al. |
| 7,425,806 | B2 | 9/2008 | Schnetzka et al. |
| 8,264,192 | B2 | 9/2012 | Green et al. |
| 8,488,344 | B2 | 7/2013 | Kono et al. |
| 9,036,386 | B2 | 5/2015 | Earanky |
| 9,054,588 | B2 | 6/2015 | Takata et al. |
| 9,099,935 | B2 | 8/2015 | Swamy |
| 9,246,398 | B2 | 1/2016 | Sakakibara et al. |
| 9,331,561 | B2 | 5/2016 | Kolar et al. |
| 9,455,633 | B2 | 9/2016 | Olea et al. |
| 9,577,429 | B2 | 2/2017 | Wallace et al. |
| 9,614,461 | B2 | 4/2017 | Becker |
| 9,621,101 | B2 | 4/2017 | Kane |
| 9,698,709 | B2 | 7/2017 | Sakai |
| 10,291,111 | B1* | 5/2019 | Rosado ................. H02M 7/493 |
| 11,056,983 | B1* | 7/2021 | Wu .......................... H02M 1/12 |
| 2002/0149953 | A1* | 10/2002 | Smedley .................. H02J 3/38 363/84 |
| 2007/0070660 | A1* | 3/2007 | Tallam .................... H02P 21/16 363/44 |
| 2007/0216343 | A1* | 9/2007 | Rozman .............. H02M 5/4585 318/811 |
| 2008/0204160 | A1* | 8/2008 | Prodic ................... H02M 3/156 332/109 |
| 2008/0284252 | A1* | 11/2008 | Jones ...................... H02J 3/40 307/82 |
| 2009/0003020 | A1* | 1/2009 | Zhang .................... H02M 1/32 363/65 |
| 2010/0314872 | A1* | 12/2010 | Wagoner ............. H02M 5/4585 290/44 |
| 2011/0227681 | A1* | 9/2011 | MacLennan ............ H01F 27/10 336/57 |
| 2012/0063181 | A1* | 3/2012 | Chimento ............. H02M 7/793 363/56.03 |
| 2013/0208517 | A1* | 8/2013 | Mashal .................... H02M 1/12 363/40 |
| 2014/0070787 | A1* | 3/2014 | Arno ....................... H02M 3/07 323/304 |
| 2014/0376293 | A1* | 12/2014 | West ..................... H02M 7/487 363/131 |
| 2015/0035467 | A1* | 2/2015 | MacLennan .......... H02M 1/126 318/503 |
| 2016/0156291 | A1* | 6/2016 | Becker .................... H02M 7/68 318/400.26 |
| 2016/0349818 | A1* | 12/2016 | Sonnaillon ........ H02M 7/53873 |
| 2017/0063215 | A1* | 3/2017 | Nikitin ..................... H02M 1/12 |
| 2017/0117748 | A1* | 4/2017 | Mondal .................... H02M 1/12 |
| 2017/0237334 | A1* | 8/2017 | Kawashima ............. H02M 1/12 363/44 |
| 2017/0294853 | A1* | 10/2017 | Flannery ................ H02J 3/1857 |
| 2018/0138805 | A1* | 5/2018 | Wu ........................ H02M 7/493 |
| 2018/0262103 | A1* | 9/2018 | Afsharian ............ H02M 1/4233 |
| 2018/0301979 | A1* | 10/2018 | Iwazaki ................ H02M 7/003 |
| 2019/0006966 | A1* | 1/2019 | Valdivia Guerrero ...................... H02M 7/5395 |
| 2019/0140535 | A1* | 5/2019 | Zhang ........................ H02J 3/01 |
| 2021/0359595 | A1* | 11/2021 | Everts ....................... H02J 7/02 |

OTHER PUBLICATIONS

Hon et al., "Harmonic Reduction System Using Active Filter", URL:<http://www.tjprc.org/publishpapers/-1373090305-6.Harmonic%20Reduction%20System.full.pdf>, 8 pages.

International Search Report and Written Opinion for PCT Application No. PCT/US2018/052950, dated Dec. 19, 2018, pp. 1-15.

Singhai, "PLL Based Shunt Active Harmonic Filter to Compensate Multiple Non linear Loads", URL:<https://www.slideshare.net/iaeme/pll-based-shunt-active-harmonic-filter-to-compensate-multiple-non-linear-loads>, pp. 198-205.

* cited by examiner

PULSE WIDTH MODULATION INTERLEAVING

CROSS-REFERENCE TO RELATED APPLICATIONS

This application is a National Phase of PCT Application No. PCT/US2018/052950 filed Sep. 26, 2018 which claims the benefit of priority to Provisional Application No. 62/564,880 filed Sep. 28. 2017, the disclosure of which is incorporated herein by reference in its entirety.

BACKGROUND

The following description relates to chillers and, more specifically, to pulse width modulation (PWM) interleaving to cancel ripple currents for high tier chiller applications.

An active harmonic filter (AHF) is an analog or digital device that is installed on a coupling point to a line in parallel with a rectifier front end type variable frequency drive and is configured to measure power quality on the grid or the rectifier side and to inject current from the coupling point to the electrical grid accordingly. That is, the AHF injects the current into the line in order to compensate for any unwanted deviations from the standard current (i.e., 50 or 60 Hz supply) as found from the measurements. Such deviations can be partially mitigated or mitigated in full.

In some cases, such as those where the load includes a rectifier front end type variable frequency drive in high tier chiller applications, the deviations may be present in the form of current harmonics. Here, when an AHF is used to reduce the current harmonics on the grid side, ripple currents may be generated by switching pulse width modulation (PWM) from the AHF. These ripple currents at PWM switching frequencies or at higher frequencies and can propagate back to the electrical grid and cause voltage variations which may impact or cause issues on other loads in the system.

BRIEF DESCRIPTION

According to an aspect of the disclosure, a pulse width modulation (PWM) interleaving system is provided. The PWM interleaving system includes active harmonic filters (AHFs). The AHFs are disposed in parallel with each other and with a load. The AHFs are electrically coupled to a common coupling point that is electrically interposed between a grid and the load. The AHFs are configured to affect, by PWM, a characteristic of current flowing between the grid and the load. The PWM interleaving system further includes a controller operably coupled to the AHFs and configured to synchronize the PWMs of the AHFs to thereby cancel ripple currents propagating towards the grid.

In accordance with additional or alternative embodiments, the load includes a chiller.

In accordance with additional or alternative embodiments, the controller includes a master-slave micro controller unit (MCU) disposed in the AHFs.

In accordance with additional or alternative embodiments, the AHFs include first and second parallel AHFs and the controller synchronizes the PWMs of the first and second AHFs to exhibit a 180° phase shift.

In accordance with additional or alternative embodiments, the AHFs include an even total number of first and second parallel AHFs and the controller synchronizes the PWMs of corresponding ones of the first and second AHFs to exhibit a 180° phase shift.

In accordance with additional or alternative embodiments, the AHFs include an odd total number of first and second parallel AHFs and the controller synchronizes the PWMs of corresponding ones of the first and second AHFs to exhibit a 180° phase shift without synchronizing the PWM of an additional one of the first and second AHFs or synchronizes the PWMs of the first and second AHFs to exhibit a total phase shift of 360°.

In accordance with additional or alternative embodiments, the controller moderates synchronization of the PWMs of the AHFs to exhibit a controllable phase shift.

According to another aspect of the disclosure, a pulse width modulation (PWM) interleaving system is provided. The PWM interleaving system includes an input line by which upstream current is carried from a grid, an output line by which downstream current is carried toward a load, active harmonic filters (AHFs) disposed in parallel with each other and with the load and a controller. The AHFs are electrically coupled to a common coupling point that is electrically interposed between the input and output lines and are configured to affect, by PWM, a characteristic of the downstream current. The controller is operably coupled to the AHFs and configured to synchronize the PWMs of the AHFs to thereby cancel ripple currents propagating towards the grid in the upstream current.

In accordance with additional or alternative embodiments, the grid includes an electrical grid and the load includes a rectifier front end type variable frequency drive in a high tier chiller.

In accordance with additional or alternative embodiments, the controller includes a master-slave micro controller unit (MCU) disposed in the AHFs.

In accordance with additional or alternative embodiments, the AHFs include first and second parallel AHFs and the controller synchronizes the PWMs of the first and second AHFs to exhibit a 180° phase shift.

In accordance with additional or alternative embodiments, the AHFs include an even total number of first and second parallel AHFs and the controller synchronizes the PWMs of corresponding ones of the first and second AHFs to exhibit a 180° phase shift.

In accordance with additional or alternative embodiments, the AHFs include an odd total number of first and second parallel AHFs and the controller synchronizes the PWMs of corresponding ones of the first and second AHFs to exhibit a 180° phase shift without synchronizing the PWM of an additional one of the first and second AHFs.

In accordance with additional or alternative embodiments, the AHFs include an odd total number of first and second parallel AHFs and the controller synchronizes the PWMs of the first and second AHFs to exhibit a total phase shift of 360°.

In accordance with additional or alternative embodiments, the controller moderates synchronization of the PWMs of the AHFs to exhibit a controllable phase shift.

According to yet another aspect of the disclosure, a pulse width modulation (PWM) interleaving method is provided for use with a system in which active harmonic filters (AHFs) are disposed in parallel with each other and a load. The AHFs are electrically coupled to a common coupling point that is electrically interposed between a grid and the load. The PWM interleaving method includes executing PWM of each of the AHFs to affect a characteristic of current flowing between the grid and the load and synchronizing the executing of the PWM of each of the AHFs to cancel ripple currents propagating towards the grid.

In accordance with additional or alternative embodiments, the AHFs include first and second parallel AHFs and the synchronizing includes synchronizing the PWMs of the first and second AHFs to exhibit a 180° phase shift.

In accordance with additional or alternative embodiments, the AHFs include an even total number of first and second parallel AHFs and the synchronizing includes synchronizing the PWMs of corresponding ones of the first and second AHFs to exhibit a 180° phase shift.

In accordance with additional or alternative embodiments, the AHFs include an odd total number of first and second parallel AHFs and the synchronizing includes one of synchronizing the PWMs of corresponding ones of the first and second AHFs to exhibit a 180° phase shift without synchronizing the PWM of an additional one of the first and second AHFs and synchronizing the PWMs of the first and second AHFs to exhibit a total phase shift of 360°.

In accordance with additional or alternative embodiments, the PWM interleaving method further includes measuring remaining ripple currents propagating towards the grid from the AHFs and moderating a synchronization of the PWMs of the AHFs to exhibit a controllable phase shift based on results of the measuring.

These and other advantages and features will become more apparent from the following description taken in conjunction with the drawings.

BRIEF DESCRIPTION OF THE DRAWINGS

The subject matter, which is regarded as the disclosure, is particularly pointed out and distinctly claimed in the claims at the conclusion of the specification. The foregoing and other features, and advantages of the disclosure are apparent from the following detailed description taken in conjunction with the accompanying drawings in which:

DETAILED DESCRIPTION

As will be described below, a system is provided which synchronizes pulse width modulations (PWMs) from two parallel active harmonic filters (AHFs) and thereby provides for a 180° phase shift on the PWMs. In this way, ripple currents generated by the respective PWMs from both AHFs will have a 180° phase difference and will cancel each other out on an electrical grid side of the AHFs. The system can include any even or odd numbers of AHFs.

With reference to FIGS. 1-4, a PWM interleaving system 10 is provided and includes an input line 11, an output line 12, a first AHF 13, a second AHF 14, which is disposed in parallel with the first AHF 13, a controller 15, an electrical grid 20, a load 30, such as a rectifier front end type variable frequency drive in a high tier chiller 301, and a common coupling point 1112. The common coupling point 1112 is electrically interposed between the grid 20 and the load 30 and, more particularly, between the input line 11 and the output line 12. Upstream current is carried from the electrical grid 20, along the input line 11 to the common coupling point 1112 and from the common coupling point 1112 to the first and second AHFs 13 and 14 and to the load 30 as downstream current along the output line 12. The first and second AHFs 13 and 14 are thus disposed electrically in parallel with each other and with the load 30.

Figure 1:
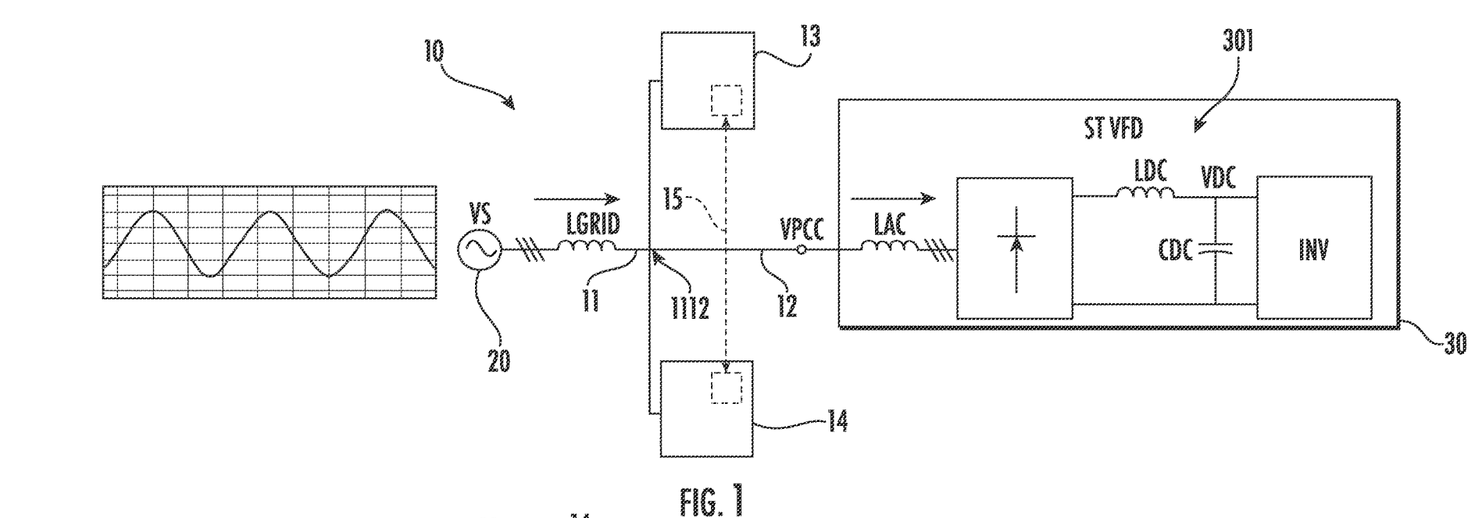
FIG. 1 is a schematic illustration of a pulse width modulation (PWM) interleaving system in accordance with embodiments.

The first and second AHFs 13 and 14 may be, but are not required to be, configured to measure a characteristic of the upstream current carried by and along the input line 11, such as a deviation from a standard frequency, and to execute PWM based on results of that measurement to thereby affect the characteristic of the downstream current on the output line 12. In so doing, the first and second AHFs 13 and 14 may tend to generate and develop ripple effects in the upstream current which may propagate undesirably towards the electrical grid 20. As such, the controller 15 is operably coupled to the first and second AHFs 13 and 14 and is configured to synchronize the respective executions of the PWMs of the first and second AHFs 13 and 14. This synchronization may in turn cancel out the ripple currents which might otherwise be generated and developed in the upstream current carried by and along the input line 11 so that those ripple currents are thus effectively prevented from propagating towards the electrical grid 20 from the first and second AHFs 13 and 14.

Figure 2:
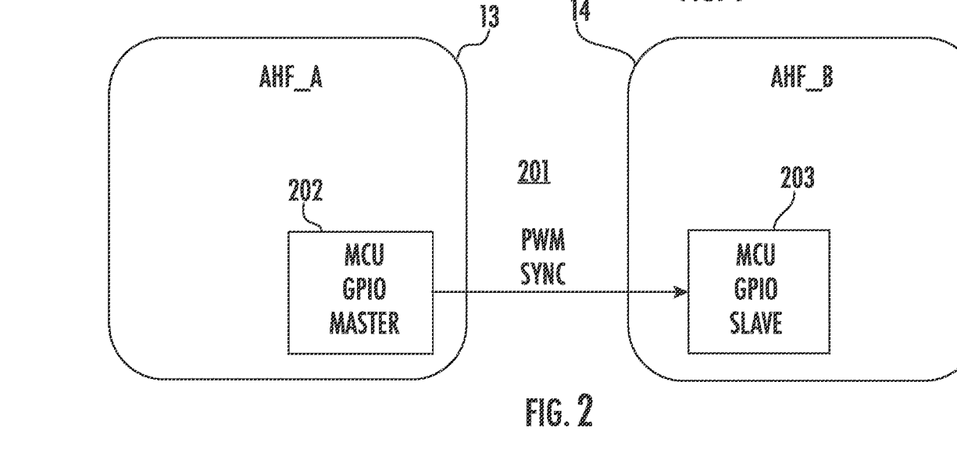
FIG. 2 is a schematic illustration of a controller of the PWM interleaving system of FIG. 1 in accordance with embodiments.
Figure 3:
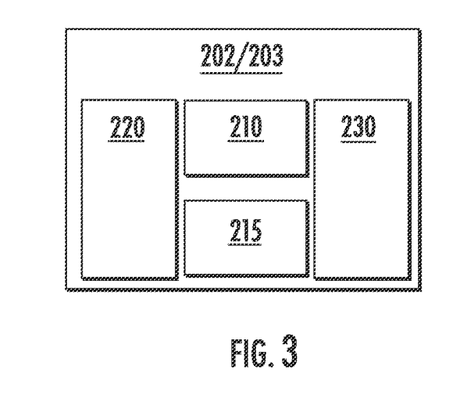
FIG. 3 is a schematic diagram illustrating components of the controller of FIG. 2 in accordance with embodiments.

In accordance with embodiments and, as shown in FIGS. 2 and 3, the controller 15 may include or be provided as a master-slave micro controller unit (MCU) 201 that includes a master element 202 and a slave element 203. The master element 202 may be disposed in the first AHF 13 and the slave element 203 may be disposed in the second AHF 14. Each of the master element 202 and the slave element 203 may include a processor 210, a PWM clock 215, a memory unit 220 and a networking unit 230 by which communications between the master element 202 and the slave element 203 are conducted. The memory unit 220 has executable instructions stored thereon for execution by the processor 210. When executed by the processor 210, the executable instructions cause the processor 210 to operate as disclosed herein.

For example, in the exemplary case of the PWM interleaving system 10 including the first and second AHFs 13 and 14, the executable instructions may cause the processor 210 of the master element 202 to identify itself as the master, the processor 210 of the slave element 203 to identify itself as the slave and to, in turn, cause the processor 210 of the master element 202 to send pulse signals based on its PWM clock 215 to the slave element 203 via the respective networking elements 230. The processor 210 of the slave element 203 then adjusts and synchs its own PWM clock 215 based on the pulse signals.

Figure 4:
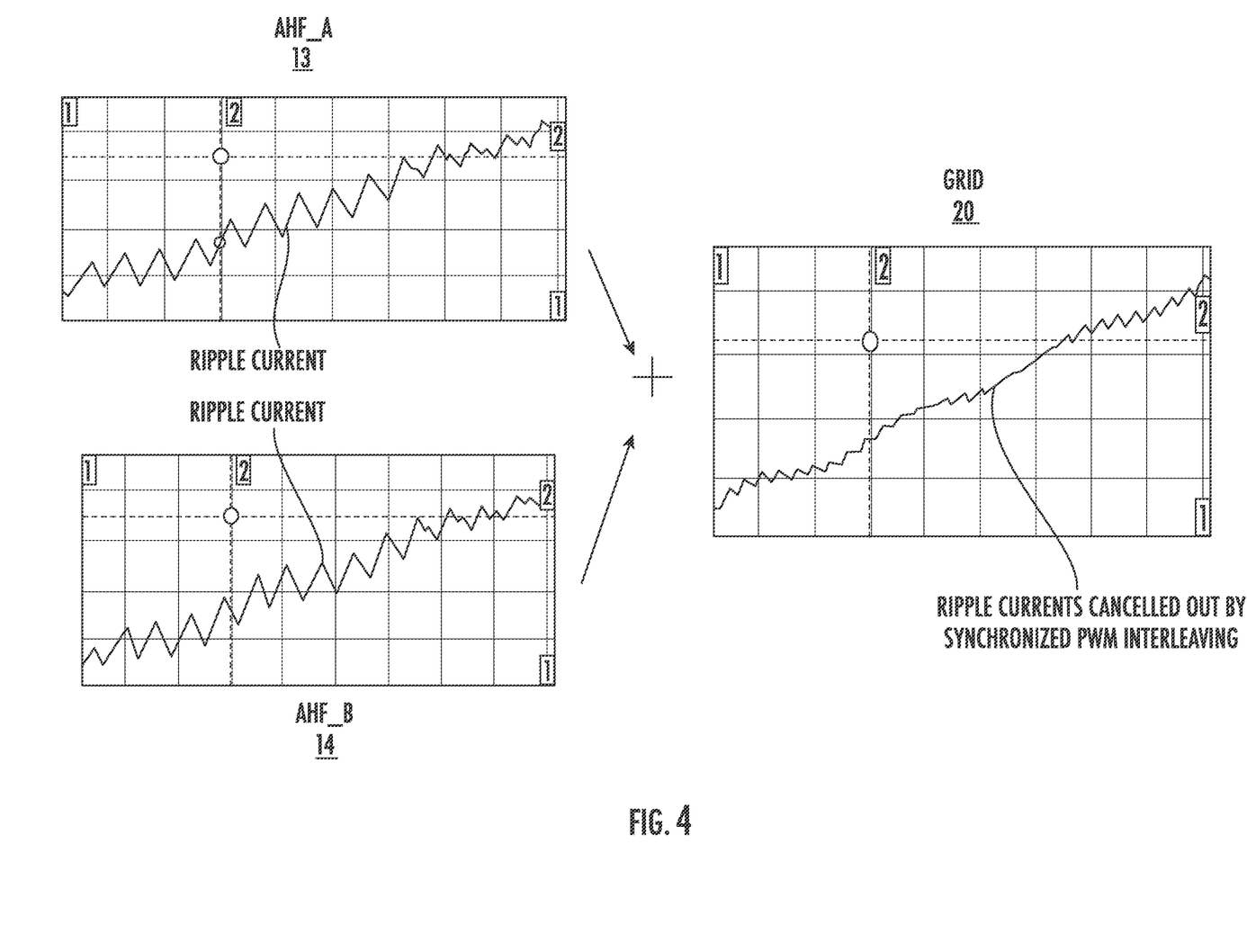
FIG. 4 is a graphical illustration of ripple current cancellation provided by the PWM interleaving system and the controller of FIGS. 1-3.

With such synchronization architecture, the controller 15 synchronizes the respective executions of the PWM of each of the first and second AHFs 13 and 14 to exhibit a 180° phase shift. Thus, as shown in FIG. 4, the respective peaks and valleys of the PWM of the first AHF 13 are cancelled out by those of the PWM of the second AHF 14 and vice versa. The resulting signal, which may be provided to propagate toward the electrical grid 20 along the input line 11, has little or substantially reduced ripple current therein.

Figure 5:
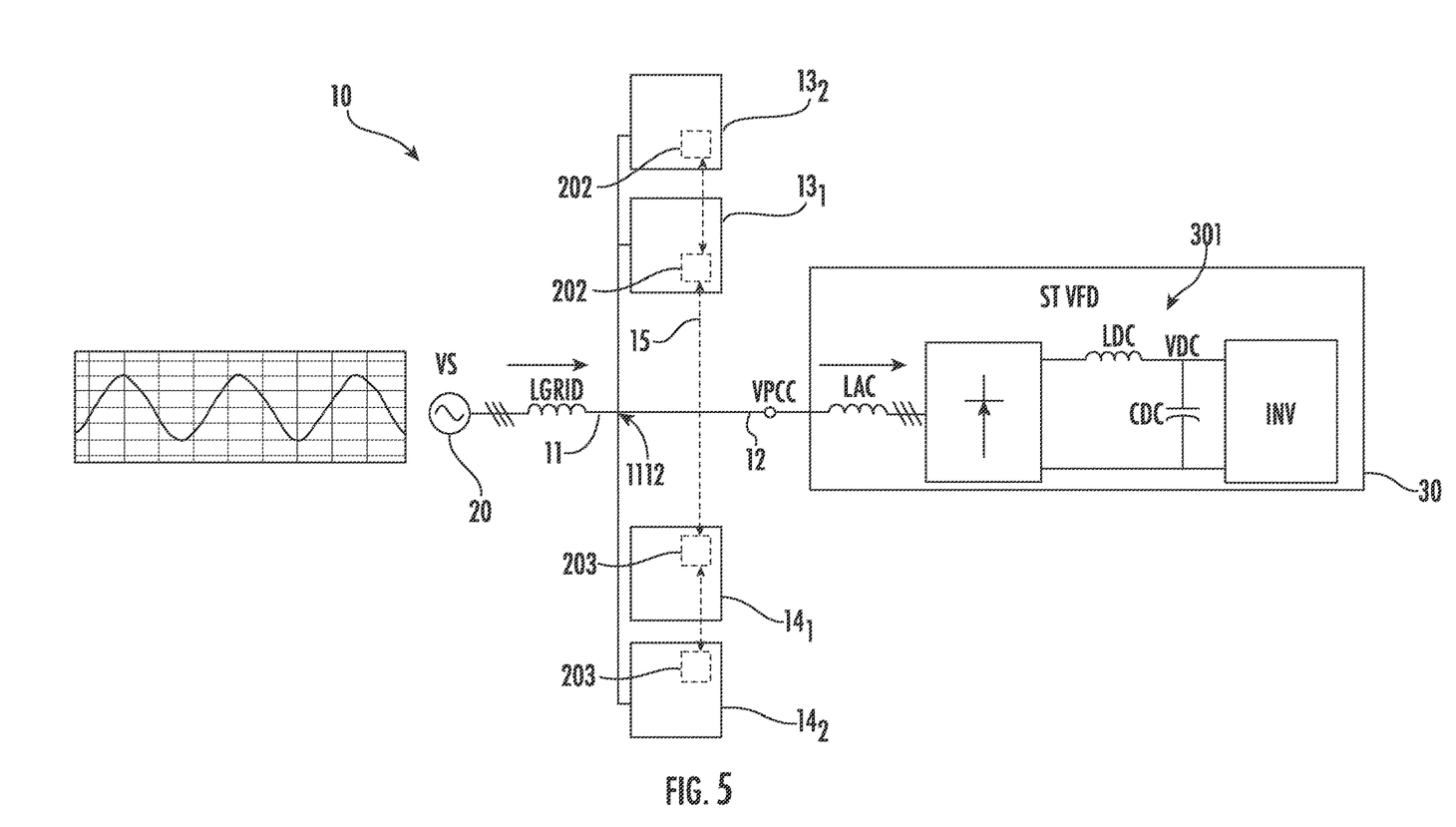
FIG. 5 is a schematic illustration of a PWM interleaving system in accordance with further embodiments.

With reference to FIG. 5, the PWM interleaving system 10 includes an even total number of first and second parallel AHFs 13 and 14 (e.g., two or more first AHFs $13_1$ and $13_2$ and a corresponding number of two or more second AHFs $14_1$ and $14_2$). In such cases, the controller 15 may be configured as described above to synchronize the respective executions of the PWM of each of the corresponding ones of the even total number of the first and second parallel AHFs $13_1$, $13_2$, $14_1$ and $14_2$ to exhibit a 180° phase shift. That is, for the PWM interleaving system 10 shown in FIG. 5, the controller 15 may be configured as described above to synchronize the respective executions of the PWM of each the first and second parallel AHFs $13_1$ and $14_1$ to exhibit a 180° phase shift and to synchronize the respective executions of the PWM of each the first and second parallel AHFs $13_2$ and $14_2$ to exhibit a 180° phase shift.

Figure 6:
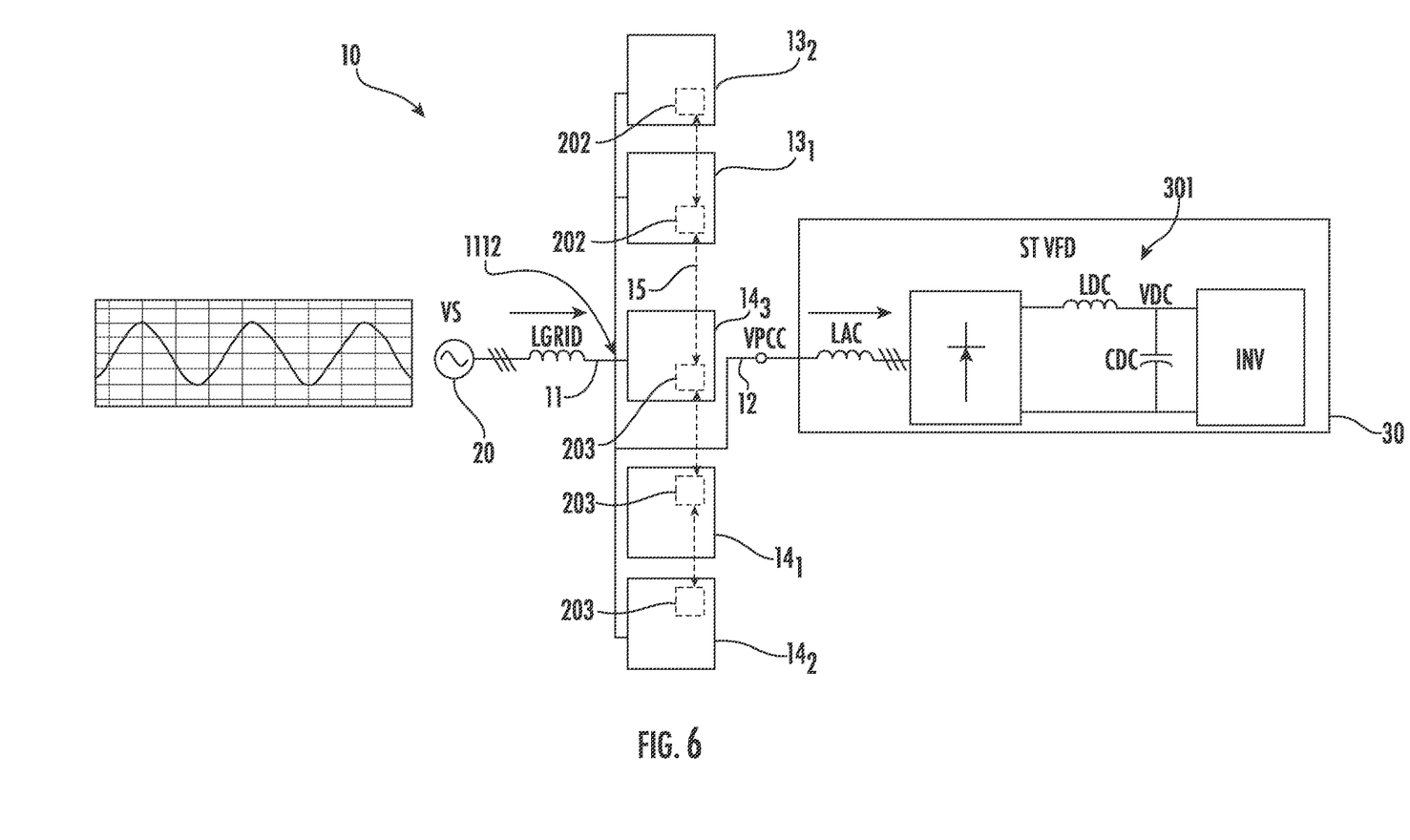
FIG. 6 is a schematic illustration of a PWM interleaving system in accordance with further embodiments.

With reference to FIG. 6, the PWM interleaving system 10 includes an odd total number of first and second parallel AHFs 13 and 14 (e.g., two or more first AHFs $13_1$ and $13_2$, a corresponding number of two or more second AHFs $14_1$ and $14_2$ and an additional second AHF $14_3$). In such cases, the controller 15 may be configured as described above to synchronize the respective executions of the PWM of each of the corresponding ones of the odd total number of the first and second parallel AHFs $13_1$, $13_2$, $14_1$ and $14_2$ to exhibit a 180° phase shift without synchronizing the additional second AHF $14_3$. That is, for the PWM interleaving system 10 shown in FIG. 6, the controller 15 may be configured as described above to synchronize the respective executions of the PWM of each the first and second parallel AHFs $13_1$ and $14_1$ to exhibit a 180° phase shift, to synchronize the respective executions of the PWM of each the first and second parallel AHFs $13_2$ and $14_2$ to exhibit a 180° phase shift but to leave the execution of the PWM of the additional second AHF $14_3$ unsynchronized.

In accordance with alternative embodiments, the controller 15 of FIG. 6 may be configured as described above to synchronize the respective executions of the PWM of each of the corresponding ones of the odd total number of the first and second parallel AHFs $13_1$, $13_2$, $14_1$, $14_2$ and $14_3$ to exhibit a total 180° phase shift. That is, for the PWM interleaving system 10 shown in FIG. 6, the controller 15 may be configured as described above to synchronize the respective executions of the PWM of each the first and second parallel AHFs $13_1$ and $14_1$ to exhibit a 180° phase shift, to synchronize the respective executions of the PWM of each the first and second parallel AHFs $13_2$, $14_2$ and $14_3$ to exhibit a 180° phase shift.

In accordance with alternative embodiments, the controller 15 of FIG. 6 may be configured as described above to synchronize the respective executions of the PWM of each of the corresponding ones of the odd total number of the first and second parallel AHFs $13_1$, $13_2$, $14_1$, $14_2$ and $14_3$ to exhibit a total phase shift of 360°. That is, for the PWM interleaving system 10 shown in FIG. 6, the controller 15 may be configured as described above to synchronize the respective executions of the PWM of each the first and second parallel AHFs $13_1$ and $14_1$, the first and second parallel AHFs $13_2$, $14_2$ and the additional second parallel AHF $14_3$ to exhibit 72° of phase shift relative to each other such that the total phase shift of 360° is obtained (for a case of three total AHFs, the phase shifts would be 120° relative to each other, for seven total AHFs, the phase shifts would be about 51.43 relative to each other, and so on . . . ).

Figure 8:
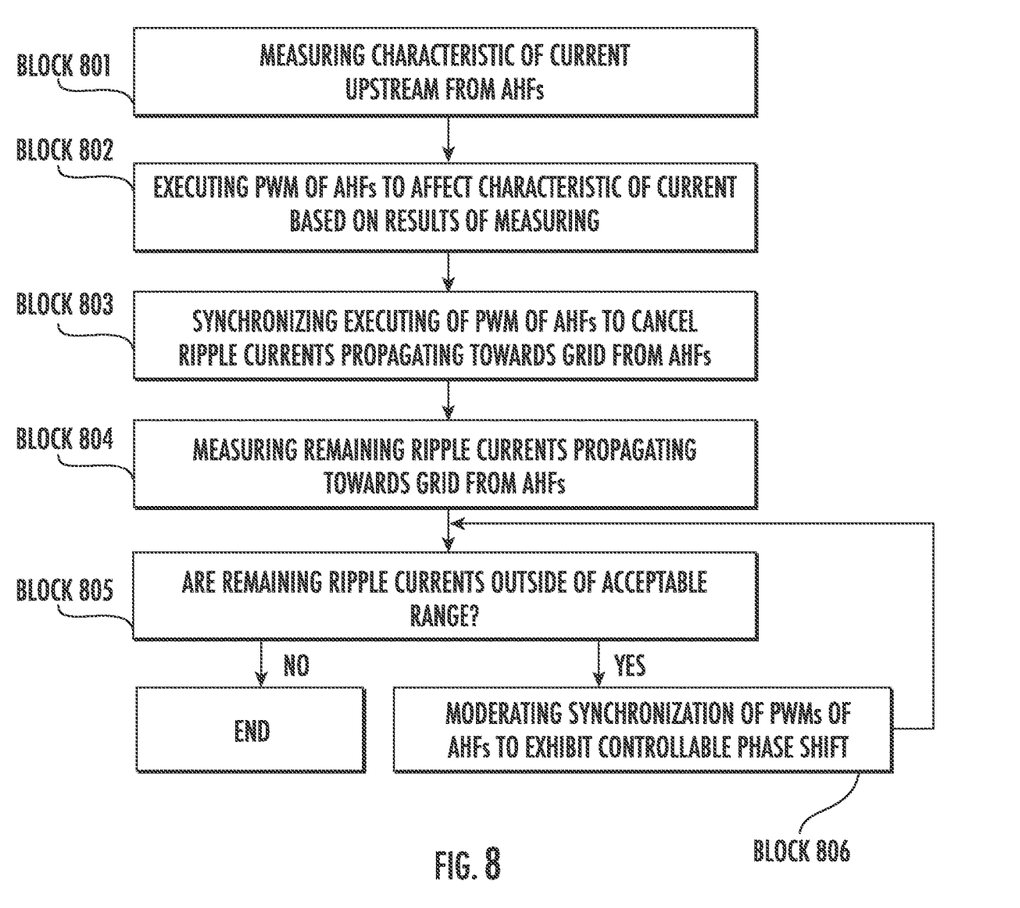
FIG. 8 is a flow diagram illustrating a PWM interleaving method in accordance with further embodiments.

In any case, the controller 15 may be, but is not required to be, further configured to operate with an open loop feedback control and/or with closed loop feedback control (see FIG. 8). For example, the controller 15 may be configured to measure remaining ripple currents propagating toward the electrical grid 20 from the first and second AHFs 13 and 14 in the PWM interleaving system 10 of FIG. 1 and to moderate a synchronization of the respective executions of the PWMs of each of the first and second AHFs 13 and 14 to thereby exhibit a controllable phase shift based on results of the measuring and to remove or further reduce the remaining ripple currents.

Figure 7:
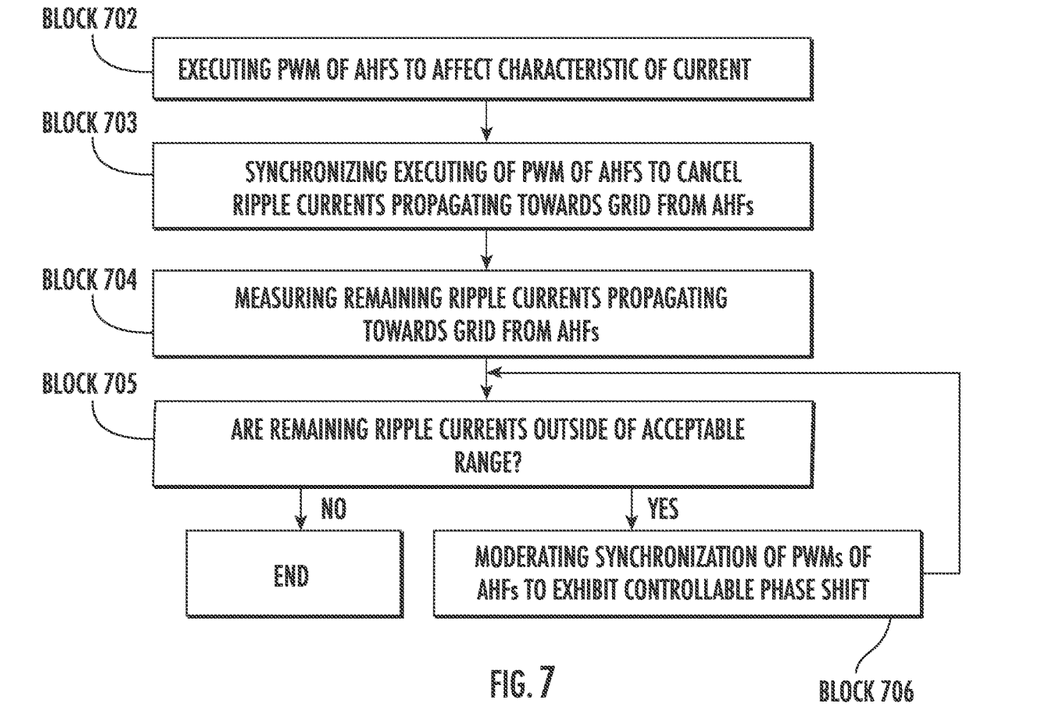
FIG. 7 is a flow diagram illustrating a PWM interleaving method in accordance with embodiments.

With reference to FIG. 7, embodiments of a pulse width modulation (PWM) interleaving method are provided for use with a system in which active harmonic filters (AHFs) are disposed in parallel with each other and with a load and where the AHFs are electrically coupled to a common coupling point that is electrically interposed between an electrical grid and the load as described above and as shown in FIGS. 1, 5 and 6. The embodiments of the PWM interleaving method described herein are exemplary and some features and operations thereof may not be required as will be understood by those with skill in the art.

As shown in FIG. 7, the embodiments of the PWM interleaving method include executing PWM of each of the AHFs to affect a characteristic of current flowing between the grid and the load (block 702) and synchronizing the executing of the PWM of each of the AHFs to cancel ripple currents propagating towards the grid from the AHFs (block 703).

In accordance with further embodiments, the AHFs may include first and second parallel AHFs and the synchronizing of block 703 may include synchronizing the PWMs of the first and second AHFs to exhibit a 180° phase shift.

In accordance with further embodiments, the AHFs may include an even total number of first and second parallel AHFs and the synchronizing of block 703 may include synchronizing the PWMs of corresponding ones of the first and second AHFs to exhibit a 180° phase shift.

In accordance with further embodiments, the AHFs may include an odd total number of first and second parallel AHFs and the synchronizing of block 703 may include synchronizing the PWMs of corresponding ones of the first and second AHFs to exhibit a 180° phase shift without synchronizing the PWM of an additional one of the first and second AHFs.

In accordance with further embodiments, the AHFs may include an odd total number of first and second parallel AHFs and the synchronizing of block 703 may include synchronizing the PWMs of the first and second AHFs to exhibit a total phase shift of 360°.

In accordance with further embodiments, the embodiments of the PWM interleaving method may also include measuring remaining ripple currents propagating towards the grid from the AHFs (block 704), determining whether the remaining ripple currents are outside of a predefined range of acceptable ripple currents based on results of the measuring (block 705) and, in an event the remaining ripple current are determined to be outside of the predefined range of acceptable ripple currents, moderating a synchronization of the PWMs of the AHFs to exhibit a controllable phase shift (block 706).

With reference to FIG. 8, embodiments of a pulse width modulation (PWM) interleaving method are provided for use with a system in which active harmonic filters (AHFs) are disposed in parallel with each other and with a load and where the AHFs are electrically coupled to a common coupling point that is electrically interposed between an electrical grid and the load as described above and as shown in FIGS. 1, 5 and 6. The embodiments of the PWM interleaving method described herein are exemplary and some features and operations thereof may not be required as will be understood by those with skill in the art.

As shown in FIG. 8, the embodiments of the PWM interleaving method include measuring a characteristic of current upstream from the common coupling point (block 801), executing PWM of each of the AHFs to affect the characteristic of the current downstream from the common coupling point based on results of the measuring (block 802) and synchronizing the executing of the PWM of each of the AHFs to cancel ripple currents propagating towards the grid from the AHFs (block 803).

In accordance with further embodiments, the AHFs may include first and second parallel AHFs and the synchronizing of block 803 may include synchronizing the PWMs of the first and second AHFs to exhibit a 180° phase shift.

In accordance with further embodiments, the AHFs may include an even total number of first and second parallel AHFs and the synchronizing of block 803 may include synchronizing the PWMs of corresponding ones of the first and second AHFs to exhibit a 180° phase shift.

In accordance with further embodiments, the AHFs may include an odd total number of first and second parallel AHFs and the synchronizing of block 803 may include synchronizing the PWMs of corresponding ones of the first and second AHFs to exhibit a 180° phase shift without synchronizing the PWM of an additional one of the first and second AHFs.

In accordance with further embodiments, the AHFs may include an odd total number of first and second parallel AHFs and the synchronizing of block 803 may include synchronizing the PWMs of the first and second AHFs to exhibit a total phase shift of 360°.

In accordance with further embodiments, the embodiments of the PWM interleaving method may also include measuring remaining ripple currents propagating towards the grid from the AHFs (block 804), determining whether the remaining ripple currents are outside of a predefined range of acceptable ripple currents based on results of the measuring (block 805) and, in an event the remaining ripple current are determined to be outside of the predefined range of acceptable ripple currents, moderating a synchronization of the PWMs of the AHFs to exhibit a controllable phase shift (block 806).

While the disclosure is provided in detail in connection with only a limited number of embodiments, it should be readily understood that the disclosure is not limited to such disclosed embodiments. Rather, the disclosure can be modified to incorporate any number of variations, alterations, substitutions or equivalent arrangements not heretofore described, but which are commensurate with the spirit and scope of the disclosure. Additionally, while various embodiments of the disclosure have been described, it is to be understood that the exemplary embodiment(s) may include only some of the described exemplary aspects. Accordingly, the disclosure is not to be seen as limited by the foregoing description, but is only limited by the scope of the appended claims.

What is claimed is:

1. A pulse width modulation (PWM) interleaving system, comprising:
   active harmonic filters (AHFs) disposed in parallel with each other and with a load,
   the AHFs being electrically coupled to a common coupling point that is electrically interposed between a grid and the load, and
   the AHFs being configured to affect, by PWM, a characteristic of current flowing between the grid and the load, and
   a controller operably coupled to the AHFs and configured to synchronize the PWMs of the AHFs to thereby cancel ripple currents propagating towards the grid,
   wherein:
   the AHFs comprise an even total number of two or more first and two or more second parallel AHFs, each of the two or more first AHFs having a corresponding one of the two or more second AHFs,
   the controller comprises a master-slave micro controller unit (MCU) disposed in each corresponding pair of the first and second AHFs,
   the controller synchronizes the PWMs of corresponding ones of the first and second AHFs to exhibit a 180° phase shift,
   the grid comprises an electrical grid and the load comprises a rectifier front end type variable frequency drive in a high tier chiller, and
   the controller moderates synchronization of the PWMs of the first and second AHFs to exhibit a controllable phase shift.

2. A pulse width modulation (PWM) interleaving system, comprising:
   an input line by which upstream current is carried from a grid;
   an output line by which downstream current is carried toward a load;
   active harmonic filters (AHFs) disposed in parallel with each other and with the load;
   the AHFs being electrically coupled to a common coupling point that is electrically interposed between the input and output lines; and
   the AHFs being configured to affect, by PWM, a characteristic of the downstream current; and
   a controller operably coupled to the AHFs and configured to synchronize the PWMs of the AHFs to thereby cancel ripple currents propagating towards the grid in the upstream current;
   wherein:
   the AHFs comprise an even total number of two or more first and two or more second parallel AHFs, each of the two or more first AHFs having a corresponding one of the two or more second AHFs,
   the controller comprises a master-slave micro controller unit (MCU) disposed in each corresponding pair of the first and second AHFs,
   the controller synchronizes the PWMs of corresponding ones of the first and second AHFs to exhibit a 180° phase shift,
   the grid comprises an electrical grid and the load comprises a rectifier front end type variable frequency drive in a high tier chiller, and
   controller moderates synchronization of the PWMs of the first and second AHFs to exhibit a controllable phase shift.

3. A pulse width modulation (PWM) interleaving method for use with a system in which active harmonic filters (AHFs) are disposed in parallel with each other and with a load, the AHFs being electrically coupled to a common coupling point that is electrically interposed between a grid and the load, the PWM interleaving method comprising:

executing PWM of each of the AHFs to affect a characteristic of current flowing between the grid and the load;
synchronizing, by a controller, the executing of the PWM of each of the AHFs to cancel ripple currents propagating towards the grid;
measuring, by the controller, remaining ripple currents propagating towards the grid from the AHFs; and
moderating, by the controller, synchronization of the PWMs of the AHFs to exhibit a controllable phase shift based on results of the measuring;
wherein:
the AHFs comprise an even total number of two or more first and two or more second parallel AHFs, each of the two or more first AHFs having a corresponding one of the two or more second AHFs,
the controller comprises a master-slave micro controller unit (MCU) disposed in each corresponding pair of the first and second AHFs,
the controller synchronizes the PWMs of corresponding ones of the first and second AHFs to exhibit a 180° phase shift, and
the grid comprises an electrical grid and the load comprises a rectifier front end type variable frequency drive in a high tier chiller.

\* \* \* \* \*